United States Patent
Bibl et al.

(10) Patent No.: US 8,945,968 B2
(45) Date of Patent: Feb. 3, 2015

(54) COMPLIANT MICRO DEVICE TRANSFER HEAD WITH INTEGRATED ELECTRODE LEADS

(71) Applicant: LuxVue Technology Corporation, Santa Clara, CA (US)

(72) Inventors: Andreas Bibl, Los Altos, CA (US); Dariusz Golda, Redwood City, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 0 days.

(21) Appl. No.: 14/312,551

(22) Filed: Jun. 23, 2014

(65) Prior Publication Data
US 2014/0299572 A1   Oct. 9, 2014

Related U.S. Application Data

(62) Division of application No. 13/605,959, filed on Sep. 6, 2012, now Pat. No. 8,791,530.

(51) Int. Cl.
*H01L 21/00*   (2006.01)
*B81C 1/00*    (2006.01)

(52) U.S. Cl.
CPC .................. *B81C 1/0015* (2013.01)
USPC ............................. 438/50; 438/52

(58) Field of Classification Search
CPC ............... H01L 2924/0002; H01L 2924/00; H01L 21/266; H01L 21/6835; H01L 2221/68368; H01L 29/06; H01L 29/0692
USPC ............... 438/50–53; 257/414, 415
See application file for complete search history.

(56) References Cited

U.S. PATENT DOCUMENTS

| 4,837,176 A | 6/1989 | Zdebel et al. |
| 5,067,002 A | 11/1991 | Zdebel et al. |
| 5,110,752 A | 5/1992 | Lu |
| 5,266,514 A | 11/1993 | Tuan et al. |
| 5,592,358 A | 1/1997 | Shamouilian et al. |
| 5,640,133 A | 6/1997 | MacDonald et al. |
| 5,745,331 A | 4/1998 | Shamouilian et al. |
| 5,771,253 A | 6/1998 | Chang-Hasnain et al. |
| 5,839,187 A | 11/1998 | Sato et al. |
| 5,851,664 A | 12/1998 | Bennett et al. |

(Continued)

FOREIGN PATENT DOCUMENTS

| JP | 07-060675 A | 3/1995 |
| JP | 3406207 | 5/1999 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Kimberly Rizkallah
*Assistant Examiner* — Duy T Nguyen
(74) *Attorney, Agent, or Firm* — Blakely, Sokoloff, Taylor & Zafman LLP

(57) ABSTRACT

A compliant micro device transfer head and head array are disclosed. In an embodiment a micro device transfer head includes a spring arm having integrated electrode leads that is deflectable into a space between a base substrate and the spring arm.

10 Claims, 12 Drawing Sheets

(56) References Cited

U.S. PATENT DOCUMENTS

| | | | |
|---|---|---|---|
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,335,263 B1 | 1/2002 | Cheung et al. | |
| 6,379,929 B1 | 4/2002 | Burns et al. | |
| 6,403,985 B1 | 6/2002 | Fan et al. | |
| 6,420,242 B1 | 7/2002 | Cheung et al. | |
| 6,521,511 B1 | 2/2003 | Inoue et al. | |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,786,390 B2 | 9/2004 | Yang et al. | |
| 6,813,291 B2 | 11/2004 | Wang et al. | |
| 6,825,105 B2 | 11/2004 | Grover et al. | |
| 6,878,607 B2 | 4/2005 | Inoue et al. | |
| 7,033,842 B2 | 4/2006 | Haji et al. | |
| 7,148,127 B2 | 12/2006 | Oohata et al. | |
| 7,208,337 B2 | 4/2007 | Eisert et al. | |
| 7,335,527 B2 | 2/2008 | Sawyer et al. | |
| 7,353,596 B2 | 4/2008 | Shida et al. | |
| 7,358,158 B2 | 4/2008 | Aihara et al. | |
| 7,585,703 B2 | 9/2009 | Matsumura et al. | |
| 7,723,764 B2 | 5/2010 | Oohata et al. | |
| 7,785,481 B2 | 8/2010 | Wang | |
| 7,795,629 B2 | 9/2010 | Watanabe et al. | |
| 7,797,820 B2 | 9/2010 | Shida et al. | |
| 7,829,366 B2 | 11/2010 | Miller et al. | |
| 7,838,410 B2 | 11/2010 | Hirao et al. | |
| 7,854,365 B2 | 12/2010 | Li et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,929,195 B2 | 4/2011 | Bifano | |
| 7,943,497 B2 | 5/2011 | Nakai | |
| 7,972,875 B2 | 7/2011 | Rogers et al. | |
| 7,989,266 B2 | 8/2011 | Borthakur et al. | |
| 7,999,454 B2 | 8/2011 | Winters et al. | |
| 8,023,248 B2 | 9/2011 | Yonekura et al. | |
| 8,333,860 B1 | 12/2012 | Bibl et al. | |
| 8,349,116 B1 | 1/2013 | Bibl et al. | |
| 8,383,506 B1 | 2/2013 | Golda et al. | |
| 8,415,767 B1 | 4/2013 | Golda et al. | |
| 8,415,768 B1 | 4/2013 | Golda et al. | |
| 2001/0029088 A1 | 10/2001 | Odajima et al. | |
| 2002/0022308 A1 | 2/2002 | Ahn et al. | |
| 2002/0061042 A1* | 5/2002 | Wang et al. | 372/43 |
| 2002/0076848 A1 | 6/2002 | Spooner et al. | |
| 2002/0168671 A1 | 11/2002 | Burns et al. | |
| 2002/0172969 A1 | 11/2002 | Burns et al. | |
| 2003/0010975 A1 | 1/2003 | Gibb et al. | |
| 2003/0022474 A1 | 1/2003 | Grover et al. | |
| 2003/0169786 A1 | 9/2003 | Kapon et al. | |
| 2003/0177633 A1 | 9/2003 | Haji et al. | |
| 2004/0056307 A1 | 3/2004 | Cho et al. | |
| 2004/0124490 A1 | 7/2004 | Bohr et al. | |
| 2004/0161943 A1 | 8/2004 | Ren et al. | |
| 2004/0232439 A1 | 11/2004 | Gibb et al. | |
| 2005/0210988 A1* | 9/2005 | Amano et al. | 73/704 |
| 2005/0232728 A1 | 10/2005 | Rice et al. | |
| 2006/0065905 A1 | 3/2006 | Eisert et al. | |
| 2006/0157721 A1 | 7/2006 | Tran et al. | |
| 2006/0160276 A1 | 7/2006 | Brown et al. | |
| 2006/0214299 A1 | 9/2006 | Fairchild et al. | |
| 2007/0048902 A1 | 3/2007 | Hiatt et al. | |
| 2007/0166851 A1 | 7/2007 | Tran et al. | |
| 2007/0194330 A1 | 8/2007 | Ibbetson et al. | |
| 2008/0048520 A1 | 2/2008 | Gulvin et al. | |
| 2008/0163481 A1 | 7/2008 | Shida et al. | |
| 2008/0194054 A1 | 8/2008 | Lin et al. | |
| 2008/0196237 A1 | 8/2008 | Shinya et al. | |
| 2008/0283190 A1 | 11/2008 | Papworth et al. | |
| 2008/0303038 A1 | 12/2008 | Grotsch et al. | |
| 2009/0068774 A1 | 3/2009 | Slater et al. | |
| 2009/0090693 A1 | 4/2009 | Wang | |
| 2009/0146303 A1 | 6/2009 | Kwon | |
| 2009/0218642 A1 | 9/2009 | Miller et al. | |
| 2009/0303713 A1 | 12/2009 | Chang et al. | |
| 2009/0314991 A1 | 12/2009 | Cho et al. | |
| 2010/0039747 A1 | 2/2010 | Sansoni et al. | |
| 2010/0046134 A1 | 2/2010 | Mizuno et al. | |
| 2010/0105172 A1 | 4/2010 | Li et al. | |
| 2010/0142114 A1 | 6/2010 | Purohit et al. | |
| 2010/0149720 A1 | 6/2010 | Fujisawa et al. | |
| 2010/0188794 A1 | 7/2010 | Park et al. | |
| 2010/0203659 A1 | 8/2010 | Akaike et al. | |
| 2010/0203661 A1 | 8/2010 | Hodota | |
| 2010/0248484 A1 | 9/2010 | Bower et al. | |
| 2010/0276726 A1 | 11/2010 | Cho et al. | |
| 2011/0003410 A1 | 1/2011 | Tsay et al. | |
| 2011/0049540 A1 | 3/2011 | Wang et al. | |
| 2011/0121462 A1 | 5/2011 | Kim | |
| 2011/0151602 A1 | 6/2011 | Speier | |
| 2011/0159615 A1 | 6/2011 | Lai | |
| 2011/0210357 A1 | 9/2011 | Kaiser et al. | |
| 2012/0064642 A1 | 3/2012 | Huang et al. | |
| 2012/0134065 A1 | 5/2012 | Furuya et al. | |
| 2013/0126891 A1 | 5/2013 | Bibl et al. | |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-079745 A | 3/2004 |
| JP | 2004-095944 A | 3/2004 |
| JP | 2006-148602 | 6/2006 |
| JP | 2008-200821 A | 9/2008 |
| JP | 2010-056458 A | 3/2010 |
| JP | 2010-186829 A | 8/2010 |
| KR | 10-2002-0022557 A | 3/2002 |
| KR | 10-2004-0030610 A | 4/2004 |
| KR | 10-0610632 B1 | 8/2006 |
| KR | 10-2007-0042214 A | 4/2007 |
| KR | 10-2007-0093091 A | 9/2007 |
| KR | 10-0800825 B1 | 1/2008 |
| KR | 10-0973928 B1 | 8/2010 |
| KR | 10-1001454 B1 | 12/2010 |
| KR | 10-2007-0006885 A | 1/2011 |
| KR | 10-2011-0075451 A | 7/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density

(56) References Cited

OTHER PUBLICATIONS of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

\* cited by examiner

COMPLIANT MICRO DEVICE TRANSFER HEAD WITH INTEGRATED ELECTRODE LEADS

RELATED APPLICATIONS

The present application is a divisional of U.S. patent application Ser. No. 13/605,959 filed on Sep. 6, 2012, which is incorporated herein by reference.

BACKGROUND

1. Field

The present invention relates to micro devices. More particularly, embodiments of the present invention relate to a compliant micro device transfer head and transfer head array and a method for forming a compliant micro device transfer head and transfer head array.

2. Background Information

Integration and packaging issues are one of the main obstacles for the commercialization of micro devices such as integration of radio frequency (RF) microelectromechanical systems (MEMS) microswitches, light-emitting diode (LED) integration onto image display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/debonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and debonded during the transfer process. Still, in both traditional and variations of the direct printing and transfer printing technologies, the transfer wafer must be debonded from a device after bonding the device to the receiving wafer. In addition, the entire transfer wafer with the array of devices is involved in the transfer process.

SUMMARY OF THE INVENTION

A compliant micro device transfer head and head array and method of forming a compliant micro device transfer head and head array are disclosed. In an embodiment, the micro device transfer head includes a base substrate, a spring anchor coupled to the base substrate, a spring arm coupled to the spring anchor, and a dielectric layer. In an embodiment, the spring arm includes a mesa structure suspended over the base substrate, a top electrode extending laterally from the spring anchor and over the mesa structure, and a bottom electrode extending laterally from the spring anchor underneath the mesa structure and wrapping around and over the mesa structure. In an embodiment, the dielectric layer covers the top electrode and the bottom electrode over the mesa structure.

The spring arm may further include a template filling an internal volume defined by the top electrode and the bottom electrode, where the template includes the mesa structure. The template may be formed from an insulating material, such as silicon dioxide, nitride, or air. The top electrode and the bottom electrode may be metal. In an embodiment, the dielectric layer covers a top surface of the top electrode. The micro device transfer head may further include a strain sensor formed over the dielectric layer at an interface of the spring anchor and the spring arm. The mesa structure may be suspended over an underlying space. In an embodiment, the spring arm is coupled to the base substrate via a dielectric layer. The underlying space may be a cavity in the dielectric layer. The micro device transfer head may additionally include a sensor electrode on a bottom surface of the underlying space, such that the sensor electrode is vertically aligned with the mesa structure. The micro device transfer head may further include routing in the base substrate, wherein the routing is electrically connected to the top electrode and bottom electrode.

In an embodiment, a method for forming a transfer head includes forming a dielectric layer over a substrate, forming a first electrode layer over the dielectric layer, forming a template on the first electrode layer, where the template includes a mesa structure, forming a second electrode layer over the template, patterning the second electrode layer and first electrode layer to form a bottom electrode and a top electrode, and removing a portion of the dielectric layer from underneath the bottom electrode to form a spring arm coupled to the substrate by a spring anchor. The spring arm may include the mesa structure, such that the mesa structure is suspended over the substrate, the top electrode extending laterally from the spring anchor and over the mesa structure, and the bottom electrode extending laterally from the spring anchor underneath the mesa structure and wrapping around and over the mesa structure.

In an embodiment, patterning the second electrode layer and first electrode layer includes forming a first negative pattern on the substrate defining a first portion of a bottom electrode, sputtering the first electrode layer over the substrate and the first negative pattern, and removing the first negative pattern along with portions of the first electrode layer formed on the first negative pattern. In an embodiment, patterning the second electrode layer and first electrode layer includes, forming a second negative pattern on the template, wherein the second negative pattern defines the top electrode and a second portion of the bottom electrode, forming the second electrode layer over the template and the second negative pattern, and removing the second negative pattern along with portions of the second electrode layer formed over the second negative pattern. In another embodiment, patterning the second electrode layer and first electrode layer includes forming a pattern to define a first portion of the bottom electrode in the first electrode layer and patterning to remove exposed portions of the first electrode layer to form the first portion of the bottom electrode. In another embodiment, patterning the second electrode layer and first electrode layer includes forming a pattern to define the top electrode and a second portion of the bottom electrode in the second electrode layer and patterning to remove exposed portions of the second electrode layer to form the second portion of the bottom electrode. The template may be formed from an insulating material or from photoresist. The method may further include removing the template. In an embodiment, the method further includes forming a dielectric layer covering the top electrode and the bottom electrode over the mesa structure.

In an embodiment of the invention, a micro device transfer head array includes a base substrate and an array of transfer heads. In an embodiment, each transfer head includes a spring anchor coupled to the base substrate, a spring arm coupled to the spring anchor, and a dielectric layer covering the top electrode and the bottom electrode over the mesa structure. In an embodiment, the spring arm includes a mesa structure suspended over the base substrate, a top electrode extending laterally from the spring anchor and over the mesa structure, and a bottom electrode extending laterally from the spring anchor underneath the mesa structure and wrapping around and over the mesa structure. The micro device transfer head array may further include routing in the base substrate, wherein the routing is electrically connected to the top electrode and bottom electrode. The micro device transfer head array may further include a conductive ground plane formed over the dielectric layer and surrounding each of the transfer heads.

DETAILED DESCRIPTION OF THE INVENTION

Figure 1:
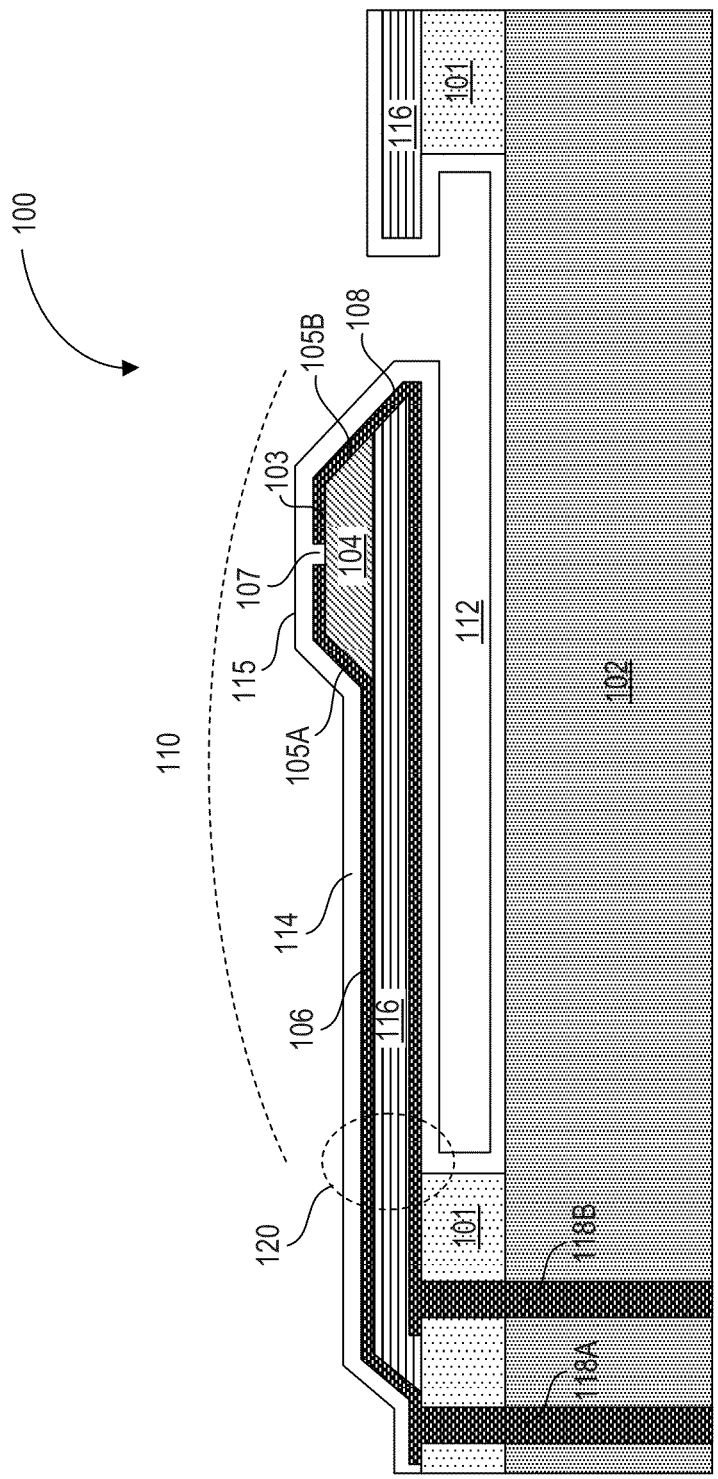
FIG. 1 is a cross-sectional side view illustration of a micro device transfer head in accordance with an embodiment of the invention.

Embodiments of the present invention describe a compliant micro device transfer head and head array, and a method of formation. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 µm. In an embodiment, the top surface of the transfer head has a maximum dimension of 3 to 10 µm. In an embodiment a pitch of an array of micro devices, and a corresponding array of electrostatic transfer heads is (1 to 100 µm) by (1 to 100 µm), for example a 10 µm by 10 µm pitch or 5 µm by 5 µm pitch.

In one aspect, embodiments of the invention describe an array of compliant transfer heads that may be used for mass transfer of an array of pre-fabricated micro devices. For example, the pre-fabricated micro devices may have a specific functionality such as, but not limited to, an LED for light-emission, silicon IC for logic and memory, and gallium arsenide (GaAs) circuits for radio frequency (RF) communications. In some embodiments, arrays of micro LED devices, which are poised for pick up, are described as having a 10 µm by 10 µm pitch, or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. A transfer tool including an array of transfer heads matching an integer multiple of the pitch of the corresponding array of micro LED devices can be used to pick up and transfer the array of micro LED devices to a receiving substrate. For example, the micro device may be contacted with the transfer head and a voltage applied to a pair of electrodes in the transfer head to create a grip pressure on the micro device. The transfer head picks up the micro device and then releases the micro device onto a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices. Each compliant transfer head in the array of compliant transfer heads may also be independently controllable, which enables selective pick up and release of the micro devices.

In another aspect, the spring arm can compensate for variations in height of the micro devices or for particulate contamination on top of a micro device. For example, one end of the spring arm is anchored to the substrate by a spring anchor, while the opposing end of the spring arm is suspended over the substrate. A spring arm associated with a taller or contaminated micro device may deflect towards the substrate more than a spring member associated with a shorter micro device in an array of micro devices, so that each compliant transfer head may make contact with each micro device, ensuring that each intended micro device is picked up.

In another aspect, the electrode components of the transfer head are an integral part of the compliant transfer head structure. For example, a top and bottom electrode function both structurally, to enable the compliant spring effect of the spring arm portion of the transfer head, and electrically, to generate the electrostatic grip pressure that picks up the micro device. In an embodiment, the electrodes solely determine the structural and deflection characteristics of the spring arm. In another embodiment, the volume between the top electrode and bottom electrode is filled with a gap material that also contributes to the structural and deflection characteristics of the spring arm.

In an embodiment, the spring arm includes two electrodes: a top electrode extending from the spring anchor and over a mesa structure, and a bottom electrode extending from the spring anchor, underneath the mesa structure, and wrapping around and over the mesa structure. In this manner, a bipolar electrode is formed on the top surface of the mesa structure. The top surface of the mesa structure is sized to correspond to the area of the top surface of the micro devices to be picked up. A dielectric layer is formed over the top and bottom electrodes over the mesa structure to provide a suitable surface for contacting a micro device with the desired grip pressure.

Each transfer head may additionally include a sensor, which can monitor an amount of deflection of the spring arm when the transfer head is brought into contact with a micro device, enabling detection of whether contact has been made with a micro device, whether a micro device is irregularly shaped or contaminated, or whether a micro device is attached to the transfer head and has successfully been picked up.

In another aspect, a method for forming the transfer head includes forming electrodes over a template comprising a mesa structure. In an embodiment, the template is retained as part of the transfer head. In another embodiment, the template is removed, resulting in a hollow transfer head defined by the top and bottom electrodes. The electrodes can be patterned, for example, by a negative liftoff method, where the metal electrode material is formed over a photoresist pattern, which is then removed to leave metal where no photoresist was formed. The electrodes can alternatively be patterned formed by deposition and patterning, for example, by conventional lithography.

Referring now to FIG. 1, a cross-sectional side view of a compliant transfer head 100 is illustrated in accordance with an embodiment of the invention. The transfer head 100 includes a spring arm 110 coupled to dielectric layer 101 on base substrate 102 via spring anchor 120. Spring arm 110 includes a top electrode 106, a bottom electrode 108, and a mesa structure 104 having a top surface 103 and tapered sidewalls 105A/105B. Top electrode 106 extends laterally from the spring anchor 120 and over the top surface 103 of a mesa structure 104. Bottom electrode 108 extends laterally from the spring anchor 120, underneath the mesa structure 104 and wraps around and over the top surface 103 of mesa structure 104. A dielectric layer 114 covers the top electrode 106 and bottom electrode 108 on the top surface 103 of mesa structure 104.

Base substrate 102 may be formed from a variety of materials such as silicon, ceramics and polymers that are capable of providing structural support. Base substrate 102 may have a conductivity between $10^3$ and $10^{18}$ ohm-cm. In an embodiment, base substrate 102 has a dielectric layer 101 disposed thereon. In an embodiment, dielectric layer 101 electrically isolates bottom electrode 108 from a semiconductor substrate 102. Dielectric layer 101 may be any appropriate dielectric material, for example silicon dioxide or silicon nitride. In an embodiment, the thickness of dielectric layer 101 is selected to correspond to the desired depth of space 112. For example, the thickness of dielectric layer 101 may be from 0.5 µm to 2 µm. In an embodiment, space 112 is a cavity in dielectric layer 101. In another embodiment, space 112 is a cavity in substrate 102.

In an embodiment, base substrate 102 and dielectric layer 101 include routing, such as through vias 118A, 118B, to connect the micro device transfer head 100 to the working electronics of an electrostatic gripper assembly. In an embodiment, a through via 118A connects to top electrode 106 and a through via 118B connects bottom electrode 108, as shown in FIG. 1. It is to be understood that base substrate 102 and dielectric layer 101 may include additional routing beyond what is illustrated in FIG. 1.

In an embodiment, top electrode 106 and bottom electrode 108 wrap around a template comprising gap material 116 and mesa structure 104. In an embodiment, gap material 116 extends from spring anchor 120, separating bottom electrode 108 from top electrode 106. In an embodiment, the gap material 116 possesses a dielectric strength greater than the applied electric field so as to avoid shorting between top electrode 106 and bottom electrode 108 during operation of the transfer head. As such, gap material 116 may be formed from a variety of materials including photoresist, polyimide, amorphous silicon, polysilicon, or dielectric materials, for example inorganic dielectrics such as silicon dioxide and silicon nitride, or organic dielectrics such as benzocyclobutene (BCB). In an embodiment, gap material 116 is filled with air. The thickness of gap material 116 may depend on a number of factors, such as the dimensions of the electrodes, the amount of deflection of the spring arm, or the voltage applied to the electrodes during a pickup operation. In an embodiment, gap material 116 is from 2 µm to 5 µm thick. In accordance with the illustrated embodiment, gap material 116 covers the surface of dielectric layer 101 that surrounds space 112, such as that shown adjacent to the suspended end of spring arm 110.

Mesa structure 104 is suspended above space 112, opposite the spring anchor 120 on spring arm 110, according to an embodiment of the invention. In an embodiment, mesa structure 104 protrudes away from base substrate 102. Mesa structure 104 has top surface 103, which may be planar, and tapered sidewalls 105A/105B. In an embodiment, sidewalls 105A/105B may be tapered up to 10 degrees, for example. Tapering the sidewalls 105A/105B may be beneficial in forming the electrodes 106/108 as described further below. Mesa structure 104 may be formed from the same or different material than gap material 116. In an embodiment, mesa structure 104 is a patterned oxide layer, such as silicon dioxide. In another embodiment, mesa structure 104 is filled with air.

The dimensions of mesa structure 104 may depend upon the specific dimensions of the micro devices to be picked up, as well as the thickness of any layers formed over the mesa structure. The specific dimensions of mesa structure 104 will be discussed below with reference to FIG. 2. In an embodiment, the height, width, and planarity of an array of mesa structures on a base substrate are uniform across the base substrate so that each micro device transfer head is capable of making contact with each corresponding micro device during the pick up operation. In an embodiment, the surface area of the top surface 115 of each micro device transfer head 100 is slightly larger, approximately the same, or less than the surface area of the top surface of the each micro device in the corresponding micro device array so that a transfer head does not inadvertently make contact with a micro device adjacent to the intended corresponding micro device during the pick up operation. Since additional layers may be formed over the mesa structure 104 (e.g. electrodes 106/108, and dielectric layer 114) the surface area of the mesa structure may account for the thickness of the overlying layers so that the surface area of the top surface 115 of each micro device transfer head is slightly larger, approximately the same, or less than the surface area of the top surface of the each micro device in the corresponding micro device array.

In an embodiment, top electrode 106 covers a portion of top surface 103 of mesa structure 104, runs down sidewall 105A of the mesa structure, and along the top surface of gap material 116 to spring anchor 120. Top electrode 106 may then connect to conductive routing, such as a through via 118A, in dielectric layer 101 and substrate 102. In an embodiment, bottom electrode 108 covers a portion of top surface 103 of mesa structure 104 and wraps around sidewall 105B, running underneath mesa structure 104 and gap material 116 to spring anchor 120. Bottom electrode 108 may also connect to conductive routing in dielectric layer 101 and substrate 102, for example a through via 118B. In an embodiment, the portions of top electrode 106 and bottom electrode 108 formed over the top surface 103 of mesa structure 104 are separated by a gap 107. In accordance with an embodiment, electrodes 106/108 cover the maximum amount of surface area of the top surface 103 of the mesa structure 104 as possible while remaining within patterning tolerances. Minimizing the amount of free space increases the capacitance and resultant grip pressure that can be achieved by the micro device transfer head.

The material from which electrodes 106/108 are formed is selected to have a suitable elastic modulus to meet the structural and deflection requirements of the spring arm and also a suitable electrical conductivity to meet the electrical requirements of the electrostatic grip function of the transfer head, according to an embodiment of the invention. A variety of conductive materials including metals, metal alloys, refractory metals, and refractory metal alloys may be employed to form top electrode 106 and bottom electrode 108. In an embodiment, electrodes 106/108 include a high melting temperature metal such as platinum or a refractory metal or refractory metal alloy. For example, an electrode may include platinum, titanium, vanadium, chromium, zirconium, niobium, molybdenum, ruthenium, rhodium, hafnium, tantalum, tungsten, rhenium, osmium, iridium and alloys thereof. Refractory metals and refractory metal alloys generally exhibit higher resistance to heat and wear than other metals. Top electrode 106 and bottom electrode 108 may be from 100 to 1000 nm thick. In an embodiment, electrodes 106/108 are each an approximately 500 Å (0.05 µm) thick layer of titanium tungsten (TiW) refractory metal alloy.

In an embodiment, dielectric layer 114 is formed on the surfaces of spring arm 110 and underlying space 112. In an embodiment, dielectric layer 114 covers the exposed surfaces of the top electrode 106 and bottom electrode 108 forming the spring arm 110. The dielectric layer 114 may also cover other exposed layers on transfer head 100, dielectric layer 101, substrate 102, and gap material 116. In an embodiment, the dielectric layer 114 has a suitable thickness and dielectric constant for achieving the required grip pressure of the micro device transfer head 100, and sufficient dielectric strength to not break down at the operating voltage. The dielectric layer 114 may be a single layer or multiple layers. In an embodiment, the dielectric layer 114 is 0.5 µm to 2.0 µm thick, though the thickness may be more or less depending upon the specific topography of the transfer head 100 and underlying mesa structure 104. Suitable dielectric materials may include, but are not limited to, aluminum oxide ($Al_2O_3$) tantalum oxide ($Ta_2O_5$), hafnium ($HfO_2$), and silicon dioxide ($SiO_2$).

In accordance with embodiments of the invention, the dielectric layer 114 possesses a dielectric strength greater than the applied electric field so as to avoid shorting of the transfer head during operation. The dielectric layer 113 can be deposited by a variety of suitable techniques such as chemical vapor deposition (CVD), atomic layer deposition (ALD) and physical vapor deposition (PVD) such as sputtering. The dielectric layer 114 may additionally be annealed following deposition. In one embodiment, the dielectric layer 114 possesses a dielectric strength of at least 400 V/µm. Such a high dielectric strength can allow for the use of a thinner dielectric layer. Techniques such as ALD can be utilized to deposit uniform, conformal, dense, and/or pin-hole free dielectric layers with good dielectric strength. Multiple layers can also be utilized to achieve such a pin-hole free dielectric layer. Multiple layers of different dielectric materials may also be utilized to form dielectric layer 114. In an embodiment, the underlying electrodes 106/108 include platinum or a refractory metal or refractory metal alloy possessing a melting temperature above the deposition temperature of the dielectric layer material(s) so as to not be a limiting factor in selecting the deposition temperature of the dielectric layer 114.

The materials and dimensions of the components of transfer head 100 are selected to enable deflection of spring arm 110 into space 112 over the working temperature range of the micro device transfer process. In an embodiment, the components and dimensions of spring arm 110 are selected to enable deflection of approximately 0.5 µm into space 112 when the top surface of transfer head 100 is subjected to up to 10 atm of pressure at operating temperatures up to 350° C.

Figure 2:
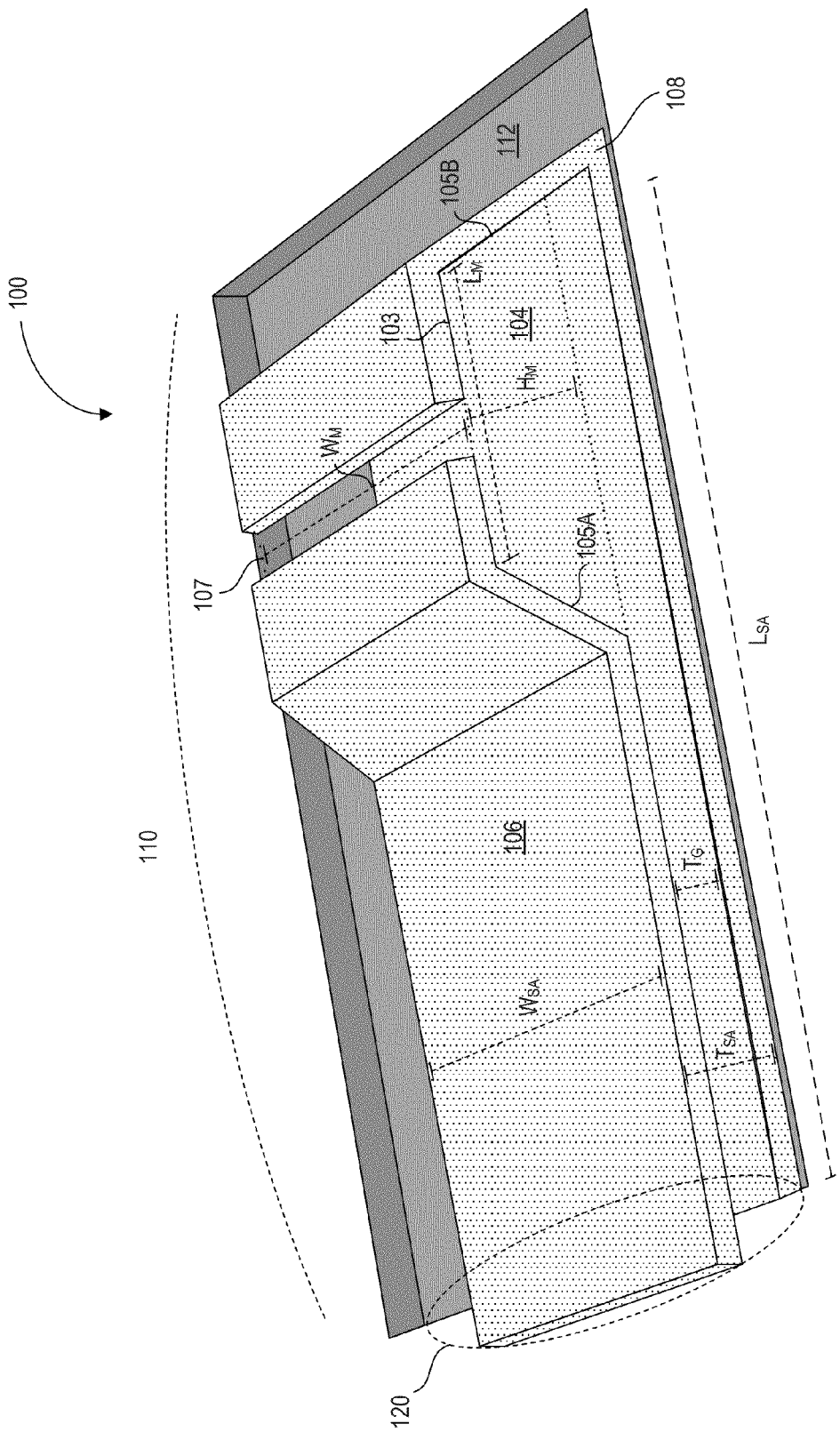
FIG. 2 is an isometric illustration of a micro device transfer head in accordance with an embodiment of the invention.

Referring now to FIG. 2, an isometric view of a compliant transfer head 100 is illustrated in accordance with an embodiment of the invention. Certain features and components of the transfer head 100 that are illustrated in FIG. 1 are omitted in FIG. 2 in order to more clearly illustrate other features. For example, the dielectric layer covering electrodes 106/108 has been omitted.

Spring arm 110 has a thickness $T_{SA}$, width $W_{SA}$, and length $L_{SA}$, according to an embodiment of the invention. The thickness $T_{SA}$ of spring arm 110 depends on the elastic moduli and dimensions of the materials and components from which it is formed. In an embodiment, spring arm 110 has a thickness $T_{SA}$ of up to 8 µm. In an embodiment, the width $W_{SA}$ of spring arm 110 is sufficient to accommodate additional spring arm and transfer head elements, such as electrodes 106/108 and mesa structure 104. For example, where a micro device is 3 µm to 5 µm wide, the width $W_{SA}$ of the spring arm may also be 3 µm to 5 µm, and where a micro device is 8 µm to 10 µm wide, the width $W_{SA}$ of the spring arm may also be 8 µm to 10 µm. The length $L_{SA}$ of spring arm 110 is long enough to enable spring arm 110 to deflect into space 112, but less than the pitch of the transfer heads 100 in the transfer head array. In an embodiment, the length $L_{SA}$ of spring arm 110 is 10× longer than the width $W_{SA}$. In an embodiment, the length $L_{SA}$ of spring arm 124 may be from 10 µm to 100 µm.

Gap material 116 extends laterally from the spring anchor 120 between bottom electrode 108 and top electrode 106, according to an embodiment of the invention. In an embodiment, the thickness $T_G$ of gap material 116 depends on a number of factors, such as the dimensions of the electrodes, the desired amount of deflection of the spring arm, the voltage applied to the electrodes during a pickup operation. In an embodiment, the thickness $T_G$ of gap material 116 is from 2 µm to 5 µm.

Mesa structure 104 generates a profile that protrudes away from the surface of gap material 116 so as to provide a localized contact point to pick up a specific micro device during a pick up operation, according to an embodiment of the invention. The height of mesa structure 104 elevates the surface of the transfer head that will contact the micro device to be picked up, enabling targeted pickup of a corresponding micro device in a micro device array. In an embodiment, mesa structure 104 has a height $H_M$ of approximately 1 µm to 5 µm, or more specifically approximately 2 µm. The surface area dimensions ($L_M \times W_M$) of mesa structure 104 may be sized to correspond to the area of the top surface of the micro device to be picked up. The surface area of the mesa structure may account for the thickness of electrodes 106/108 and the dielectric layer (not shown) so that the surface area of the top surface of each micro device transfer head is slightly larger, approximately the same, or less than the surface area of the top surface of the each micro device in the corresponding micro device array. In an exemplary embodiment, the length $L_M$ and width $W_M$ of mesa structure 104 are each from 2 µm to 7 µm in order to achieve a top surface of the transfer head 100 having length and width dimensions that are each from 3 µm to 10 µm.

The electrodes 106/108 may cover the maximum amount of the surface area of the top surface 103 of the mesa structure 104 as possible while still preserving gap 107 between top electrode 106 and bottom electrode 108. The minimum amount of separation distance may be balanced by considerations for maximizing surface area, while avoiding electrical breakdown between the electrodes. For example, gap 107 may be 0.5 µm or less, and the minimum separation distance may be limited by the thickness of the electrodes. It is to be appreciated that the mesa array may have a variety of different pitches, and that embodiments of the invention are not limited to the exemplary 7 µm×7 µm top surface 103 of the mesa structure 104 in a 10 µm pitch.

Figure 3A:
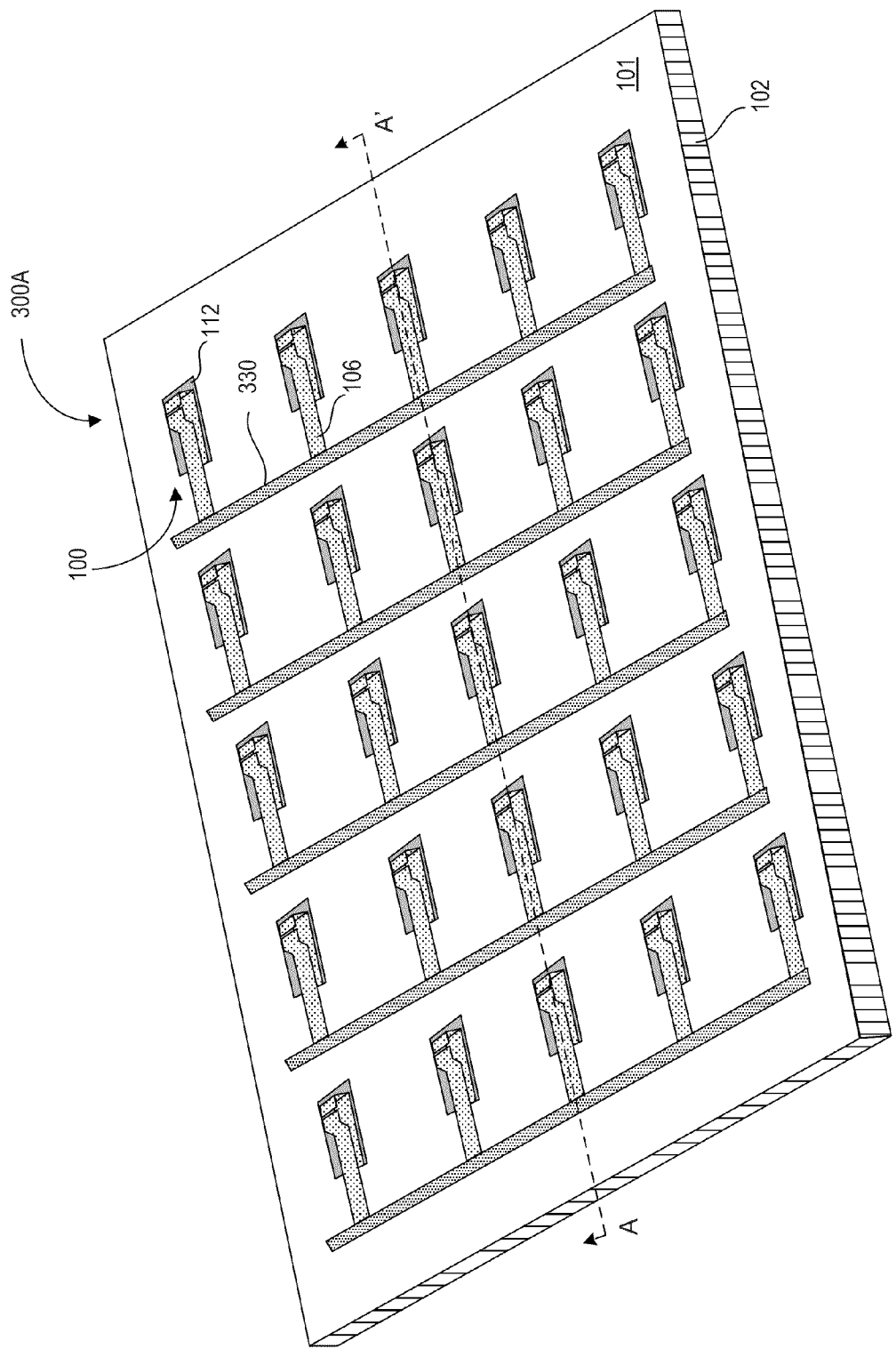
FIGS. 3A-3B are isometric illustrations of a micro device transfer head array in accordance with an embodiment of the invention.
Figure 3B:
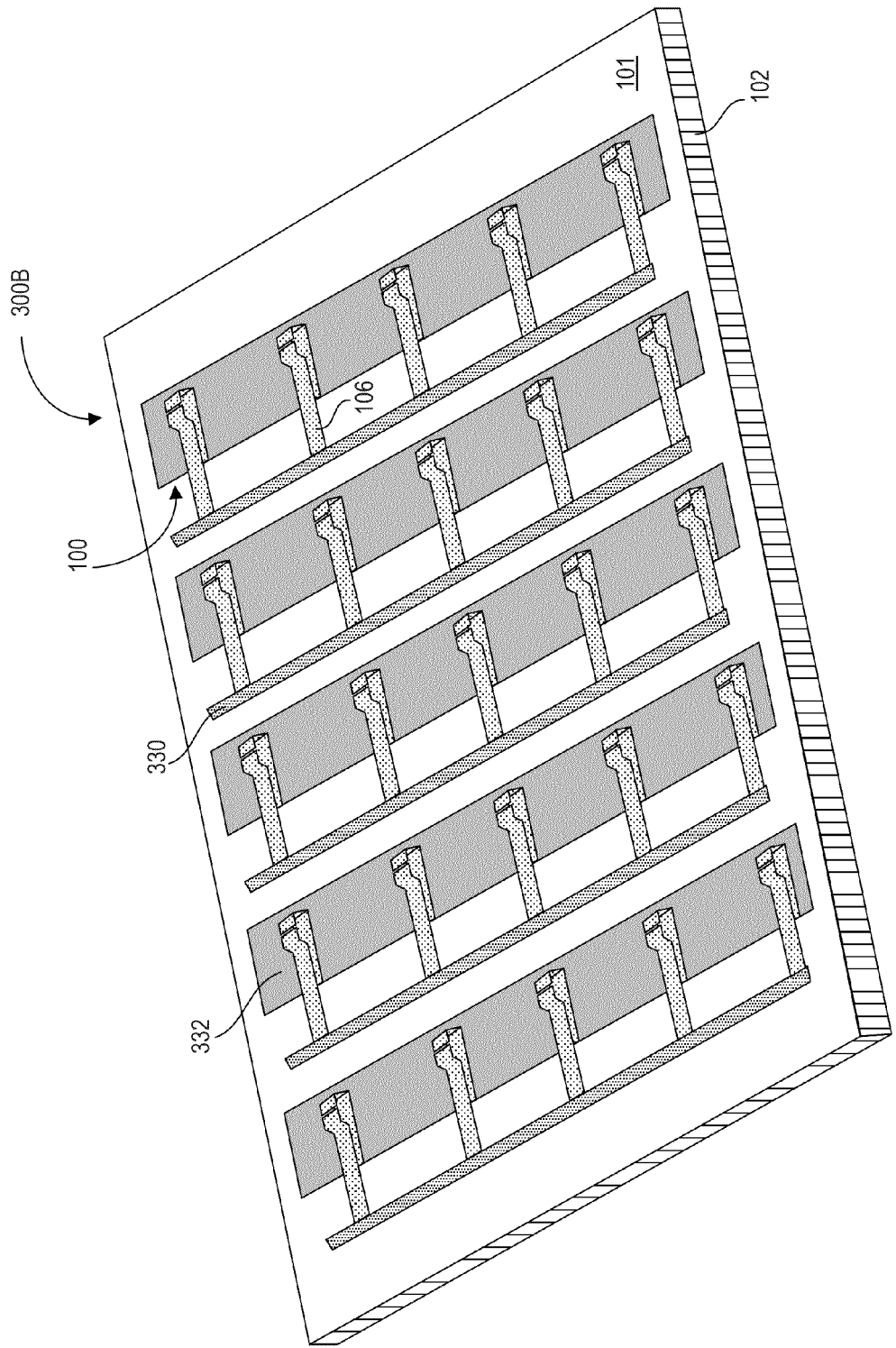

FIGS. 3A-3B are isometric view illustrations of an array of 300A/300B of micro device transfer heads 100 with a compliant bipolar electrode as previously described with regard to FIGS. 1-2. For purposes of clarity, certain elements of the transfer head have not been illustrated, for example, the dielectric layer covering the top surface of each mesa structure. In FIG. 3A, each transfer head 100 in transfer head array 300A is deflectable into an underlying space 112, according to an embodiment of the invention. FIG. 3B illustrates an embodiment of a transfer head array 300B where each transfer head 100 is deflectable into underlying trench 332 that extends underneath multiple transfer heads 100.

Each top electrode 106 of a transfer head 100 is coupled to a bus line 330, according to an embodiment of the invention. Each bottom electrode 108 may also be coupled to a separate bus line (not illustrated). In an embodiment, bus line 330 is connected to additional routing within the dielectric layer 101 and substrate 102. It is to be appreciated that additional conductive routing or different routing configurations may be used to control the transfer heads 100. In an embodiment, a conductive ground plane (not shown) is formed over the dielectric layer 101, surrounding the array of transfer heads 100 to assist in the prevention of arcing between transfer heads, particularly during the application of high operating voltages.

Figure 4A:
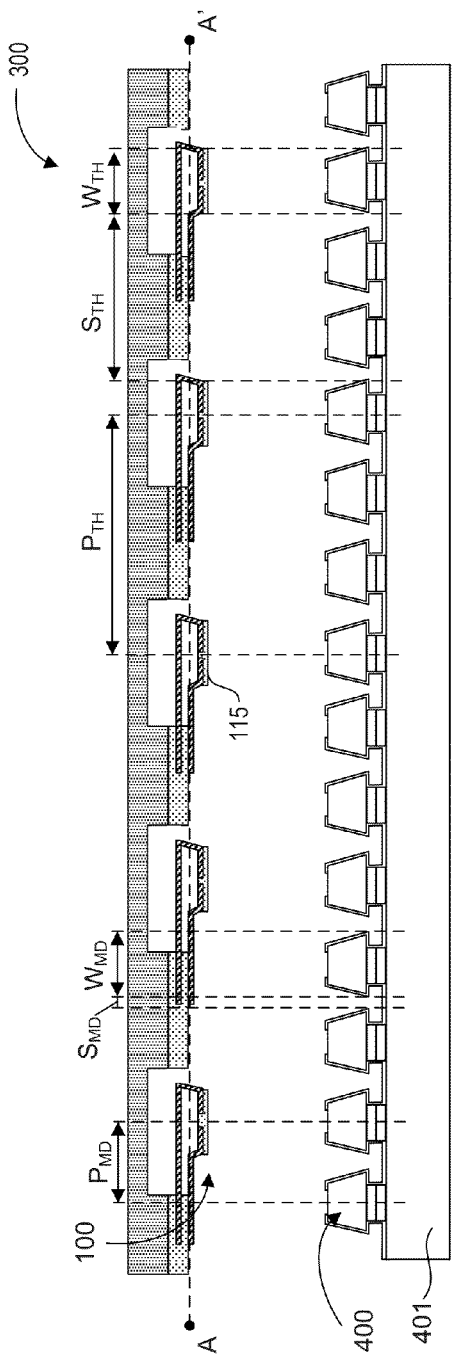
FIGS. 4A-4B are cross-sectional side view illustrations of an array of micro device transfer heads picking up an array of micro LED devices in accordance with an embodiment of the invention.
Figure 4B:
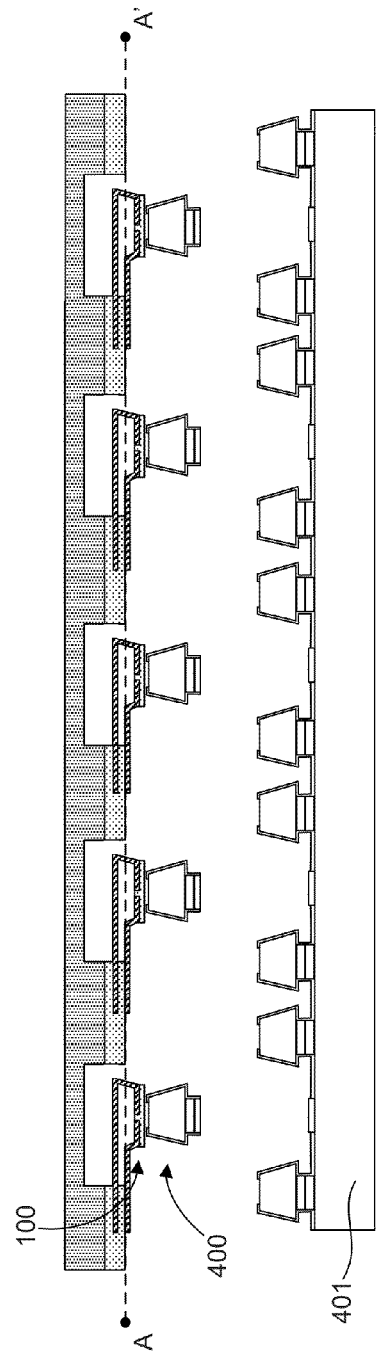

FIGS. 4A-4B are cross-sectional side view illustrations of an array of micro device transfer heads, taken along the line A-A' in FIG. 3, shown picking up an array of micro devices in accordance with an embodiment of the invention. In FIG. 4A, an array of transfer heads 100 is positioned above an array of micro LED devices 400 on carrier substrate 401, according to an embodiment. In the particular embodiment illustrated, the pitch $P_{TH}$ of the array of transfer heads 100 is an integer multiple of the pitch $P_{MD}$ of the micro LED devices 400, with the pitch $P_{TH}$ of the array of transfer heads being the sum of the spacing $S_{TH}$ between the top surfaces 115 of adjacent transfer heads 100 and the width $W_{TH}$ of the top surface 115 of a transfer head 100. In another embodiment, the pitch $P_{TH}$ of the transfer heads is equal to the pitch $P_{MD}$ of the micro LED devices.

In one embodiment, the array of micro LED devices 400 have a pitch $P_{MD}$ of 10 µm, with each micro LED device having a spacing $S_{MD}$ of 2 µm and a maximum width $W_{MD}$ of 8 µm. In an exemplary embodiment, the top surface of the each micro LED device 400 has a width $W_{MD}$ of approximately 8 µm. In such an exemplary embodiment, the width $W_{TH}$ of the top surface 115 of a corresponding transfer head 100 is approximately 10 µm or smaller so as to avoid making inadvertent contact with an adjacent micro LED device. In another embodiment, the array of micro LED devices 400 may have a pitch $P_{MD}$ of 5 µm, with each micro LED device having a spacing $S_{MD}$ of 2 µm and a maximum width $W_{MD}$ of 3 µm. In an exemplary embodiment, the top surface of the each micro LED device 400 has a $W_{MD}$ width of approximately 3 µm. In such an exemplary embodiment, the width $W_{TH}$ of the top surface 115 of a corresponding transfer head 100 is approximately 3 µm or smaller so as to avoid making inadvertent contact with an adjacent micro LED device 400. However, embodiments of the invention are not limited to these specific dimensions, and may be any suitable dimension.

FIG. 4B is a side view illustration of the array of micro device transfer heads picking up a portion of an array of micro LED devices 400 in accordance with an embodiment of the invention. In a particular embodiment illustrated in FIG. 4B, every transfer head 100 in the array is activated to pick up a micro LED device 400. In another embodiment, transfer heads 100 may be selectively activated, such that a subset of the array of transfer heads 100 picks up a micro LED device 400.

The portion of the array of micro devices may then be released onto at least one receiving substrate to complete the transfer process. Thus, the array of micro LED devices can all be released onto a single receiving substrate, or selectively released onto multiple substrates. For example, the receiving substrate may be, but is not limited to, a display substrate, a lighting substrate, a substrate with functional devices such as transistors or ICs, or a substrate with metal redistribution lines.

Figure 5A:
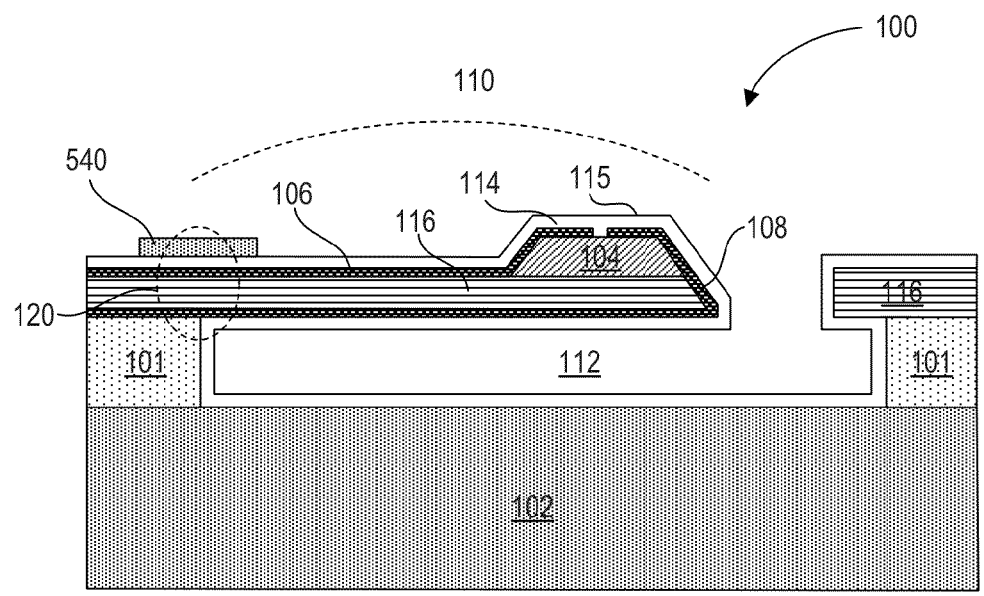
FIGS. 5A-5B are cross-sectional side view illustrations of sensor components of a micro device transfer head in accordance with an embodiment of the invention.
Figure 5B:
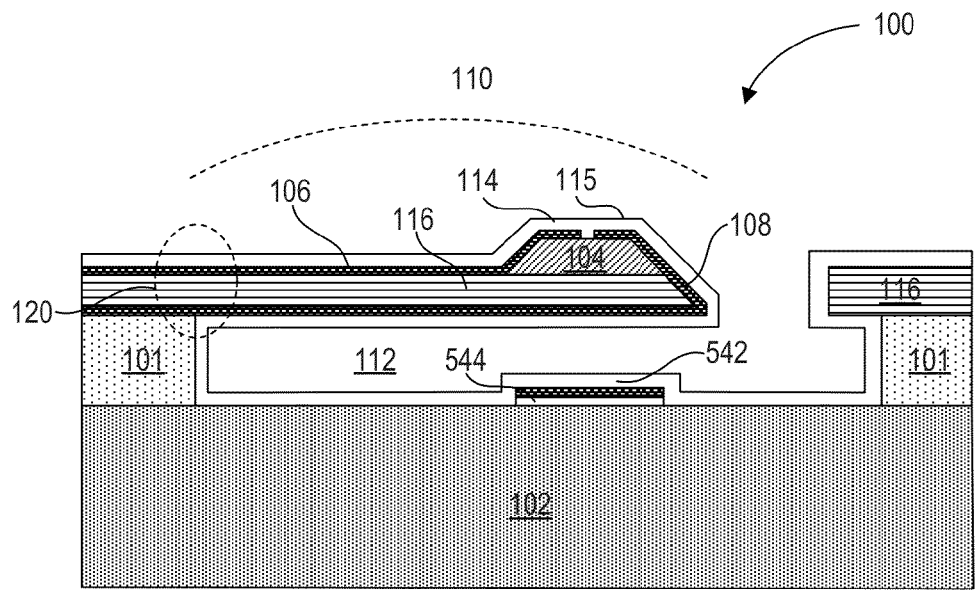

FIGS. 5A-5B each illustrate an embodiment of a micro device transfer head incorporating a sensor. Sensors can serve a variety of purposes during operation of the transfer head. For example, where a sensor is used to measure an amount of deflection of the transfer head, this information can be used to determine if (1) contact has been made with a micro device to be picked up, (2) contamination is present on the micro device, or alternatively the micro device has been damaged or deformed, or (3) whether a micro device has been picked up.

FIG. 5A illustrates a cross sectional side view of a transfer head comprising a strain sensor 540, according to an embodiment of the invention. In an embodiment, strain sensor 540 is a strain gauge capable of measuring the amount of deflection of spring arm 110 into space 112. When the top surface 115 of transfer head 100 contacts the surface of a micro device during a pick up operation, it may deflect some amount in response to the contact pressure. By measuring the amount of deflection of a spring arm 110 and comparing it to the amount of deflection known to indicate optimum contact with a micro device surface, strain sensor 540 can indicate whether the top surface 115 of transfer head 100 has contacted the top surface of a micro device in an array and as such is ready to execute a pick up operation. Detection of too little deflection may indicate that a micro device is absent from that position in the array, while detection of too much deflection may indicate separation or incomplete contact between the surface of the micro device and the surface of the transfer head due to either the presence of contamination particles or an otherwise damaged or deformed micro device. In both cases, a voltage may not be applied to the transfer head so as not to attempt to pick up the absent or damaged micro device. In the case where contamination is detected, a cleaning operation may be applied to the transfer head, micro device, or their respective array prior to reattempting the pick up operation.

In another embodiment, strain sensor 540 is capable of measuring a resonant frequency of spring arm 100. For example, a resonant frequency of spring arm 110 may be measured upon contacting the transfer head on a bare substrate and lifting off of the bare substrate without a micro device. A different resonant frequency of spring arm 110 may be measured upon contacting the transfer head to a micro device and picking up the micro device. As such, the strain sensor 540 is capable of detecting whether a micro device has been picked up, due to differences in the resonant frequency when a micro device is or is not present.

In an embodiment, strain sensor 540 is formed on dielectric layer 114 over the interface of spring anchor 120 and spring arm 110. In an embodiment, dielectric layer 114 electrically isolates sensor 540 from top electrode 106. When spring arm 110 deflects into space 112, the strain along spring arm 110 is not uniform; spring arm 110 experiences the maximum amount of strain at the interface with spring anchor 120. In an embodiment, strain sensor 540 spans the interface of spring anchor 120 and spring arm 110, so as to be subject to the maximum amount of stress associated with the deflection of spring arm 110.

In an embodiment, strain sensor 540 includes a piezoelectric material. A piezoelectric material accumulates charge in response to an applied mechanical stress. The accumulation of charge along strained surfaces of a piezoelectric sensor can generate a measurable voltage related to the amount of strain. As such, as spring arm 110 deflects into space 112, the voltage between the upper and lower surface of the strain sensor increases as the strain at the interface of spring anchor 120 and spring arm 110 increases, enabling calculation of the amount of deflection of spring arm 110. Piezoelectric materials include, for example, crystalline materials such as quartz and ceramic materials such as lead zirconate titanate (PZT).

In another embodiment, strain sensor 540 is formed from a piezoresistive material. The electrical resistivity of a piezoresistive material changes in response to an applied mechanical stress. As such, strain sensor 540 may be subject to an electrical current, so that when spring arm 110 deflects into space 112, the electrical resistivity of strain sensor 540 increases as the strain at the interface of spring anchor 120 and spring arm 110 increases, causing a measurable increase in the voltage across the sensor. The amount of deflection can be calculated from the changes in voltage. Piezoresistive materials include, for example, polycrystalline silicon, amorphous silicon, monocrystalline silicon, or germanium.

In an embodiment, spring arm 110 oscillates at a resonant frequency due to contact with a bare substrate or a micro device, as discussed above. In an embodiment, the oscillation results in a correspondingly oscillating amount of strain at the interface of spring anchor 120 and spring arm 110, which can be detected by strain sensor 540. The differences in oscillating strain for a spring arm 110 that has contacted a bare substrate versus a spring arm 110 that has picked up a micro device enable the use of a piezoelectric or piezoresistive strain sensor 540 to determine if a transfer head has successfully picked up a micro device during a pickup operation.

Referring to FIG. 5B, a sensor electrode 542 is formed on substrate 102, according to an embodiment of the invention. In an embodiment, sensor electrode 542 is formed within space 112, in alignment with mesa structure 104. In an embodiment, a layer of dielectric material 544 isolates sensor electrode 542 from semiconductor substrate 102. In another embodiment, sensor electrode 542 is formed directly on base substrate 102. In an embodiment, dielectric layer 114 covers opposing electrode 542.

In an embodiment, sensor electrode 542 and bottom electrode 108 function together as a capacitive sensor. The capacitance between two parallel conductors increases as the distance between the conductors decreases. In an embodiment, a voltage is applied across sensor electrode 542 and bottom electrode 108. As the spring arm 110 is depressed within space 112 toward base substrate 102, the distance between electrodes 542 and 108 decreases, causing the capacitance between them to increase. In this manner, the amount of deflection of spring arm 110 can be calculated from changes in the capacitance between electrodes 542 and 108 across dielectric layer 114 and space 112. Dielectric 114 prevents shorting between the electrodes in the case where spring arm 110 is fully depressed within space 112. Sensor electrode 542 may be formed from any suitable conductive material, such as those discussed above with respect to electrodes 106 and 108.

In another application, sensor electrode 542 may be used to measure the resonant frequency of spring arm 110. As discussed above, in an embodiment, spring arm 110 oscillates at a resonant frequency determined in part by the weight of elements forming spring arm 110. The oscillation may result in a corresponding oscillating capacitance between sensor electrode 542 and bottom electrode 108. After a micro device has been picked up by the transfer head, the additional weight of the micro device may change the resonant frequency of spring arm 110, resulting in changes in the oscillating capacitance as measured by electrodes 542 and 108. In this manner, electrodes 542 and 108 may be used to determine if a transfer head has successfully picked up a micro device during a pickup operation. Additionally, it may be determined whether to apply a cleaning operation to the transfer head array or micro device array prior to reattempting a pick up operation.

Figure 6A:
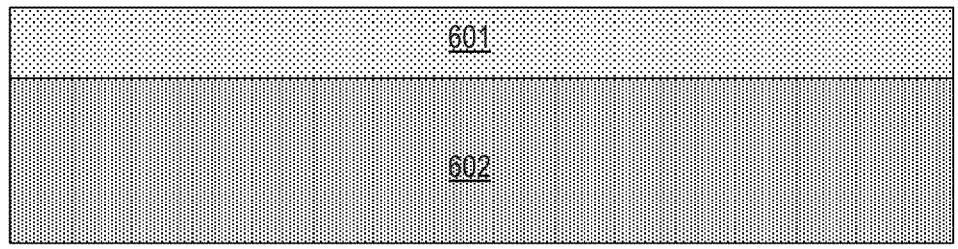
FIGS. 6A-6I are cross-sectional side view illustrations of a method for forming a micro device transfer head in accordance with an embodiment of the invention.

FIGS. 6A-6I illustrate a method for forming a micro device transfer head using a negative lift-off technique, according to an embodiment of the invention. In an embodiment, a substrate 602 having a dielectric layer 601 formed thereon is provided, as shown in FIG. 6A. Substrate 602 and dielectric layer 601 have the characteristics discussed above with respect to substrate 102 and 101, respectively. In an embodiment, base substrate 602 is silicon and dielectric layer 601 is silicon dioxide. Dielectric layer 601 and base substrate 602 may include routing (not shown) to control the subsequently formed transfer head. The thickness of dielectric layer 601 will correspond to the thickness of the subsequently formed space between the spring arm and the base substrate, and as such is chosen to enable the desired degree of deflection of the transfer head. In an embodiment, dielectric layer 601 is 0.5-2 µm thick.

Figure 6B:
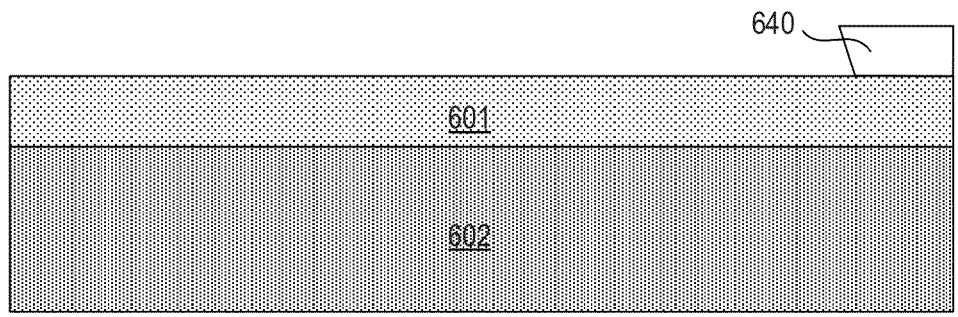

Next, in FIG. 6B, first pattern 640 is formed on the surface of dielectric layer 601 to define a portion of the bottom electrode of the transfer head. In an embodiment, first pattern 640 is formed in the areas where electrode metal is not desired. For example, first pattern 640 may be formed along the perimeter of what will be the length and width of the spring arm portion of the transfer head. In an embodiment, first pattern 640 is formed from photoresist.

Figure 6C:
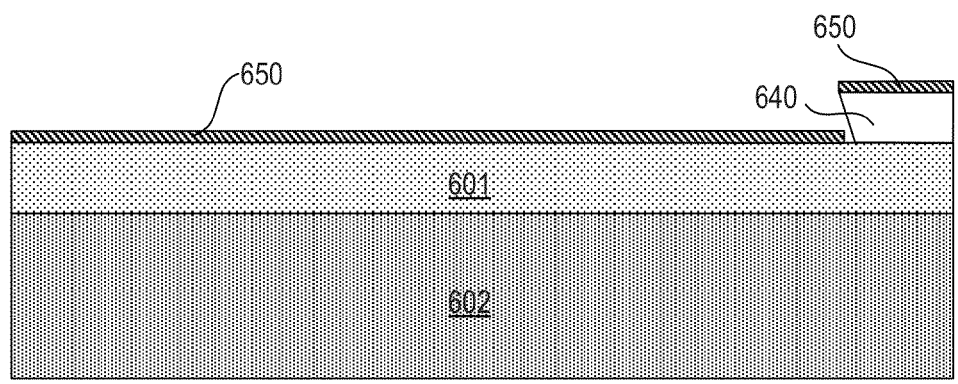

In FIG. 6C, first electrode layer 650 is formed over the surface of dielectric layer 601 and first pattern 640, according to an embodiment of the invention. First electrode layer 650 may be formed from any metal or conductive material suitable for forming the electrode elements of the spring arm of a transfer head, as discussed above with respect to materials for electrodes 106 and 108. First electrode layer 650 may be formed using any appropriate method, such as plating, CVD, or PVD. In an embodiment, first electrode layer 650 is formed by sputter deposition. First electrode layer 650 may be from 0.1-1 μm thick. In an embodiment, first electrode layer 650 is a 500 Å thick layer of TiW. In an embodiment, first pattern 640 may then be removed along with the portion of first electrode layer 650 formed thereon.

Figure 6D:
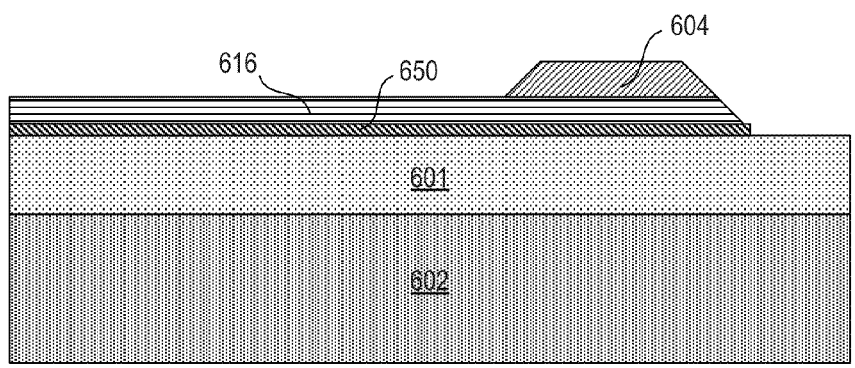

Referring now to FIG. 6D, a template is formed over first electrode layer 650. In an embodiment, the template includes gap material 616 and mesa structure 604. Mesa structure 604 may be formed from the same or different material than gap material 616. In one embodiment, mesa structure 604 is integrally formed with gap material 616. In an embodiment, the materials filling gap material 616 and mesa structure 604 are selected to be resistant to other processes used to define the transfer head. In another embodiment, the materials filling gap material 616 and mesa structure 604 are selected to be removed during subsequent processing to form the transfer head.

Gap material 616 and mesa structure 604 may each be formed from a variety of materials, including photoresist, polyimide, amorphous silicon, polysilicon, or dielectric materials, for example inorganic dielectrics such as silicon dioxide and silicon nitride, or organic dielectrics such as benzocyclobutene (BCB). For example, where gap material 616 and mesa structure 604 are formed from a dielectric such as silicon dioxide or silicon nitride, a layer of dielectric may first be blanket deposited over first electrode layer 650 and then patterned by any appropriate method known in the art to form the template comprising gap material 616 and mesa structure 604. In an embodiment, anisotropic etching techniques can be utilized to form tapered sidewalls for mesa structure 604. In another embodiment, gap material 616 and mesa structure 604 are defined using a photoresist material that is hard-baked to resist subsequent processing to form the transfer head. In another embodiment, gap material 616 and mesa structure 604 are formed from photo-defined polyimide.

The dimensions of the gap material 616 and mesa structure 604 are determined by the desired dimensions of the top surface of the transfer head after the formation of additional device components, such as the electrodes and the dielectric layer, as described above with respect to FIGS. 1-2. In an embodiment, gap material 616 is 2 to 5 μm thick. In an embodiment, mesa structures 604 are 7 μm×7 μm wide and 2 μm high.

Figure 6E:
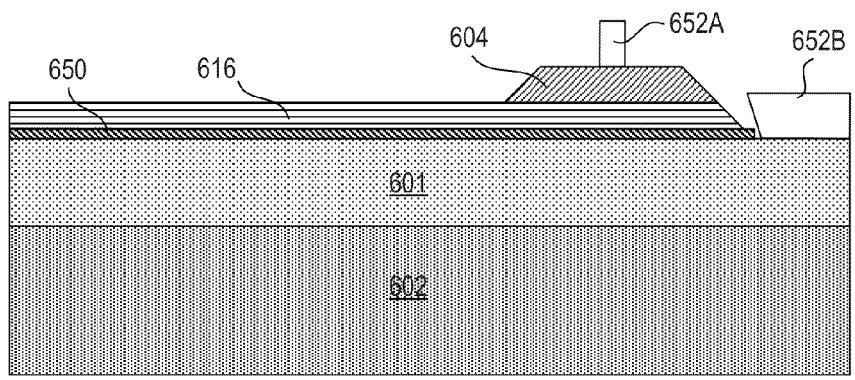
Figure 6F:
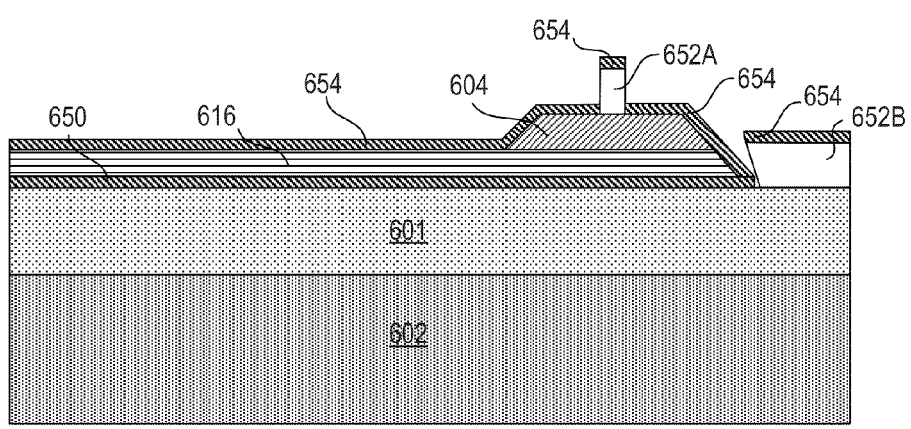
Figure 6G:
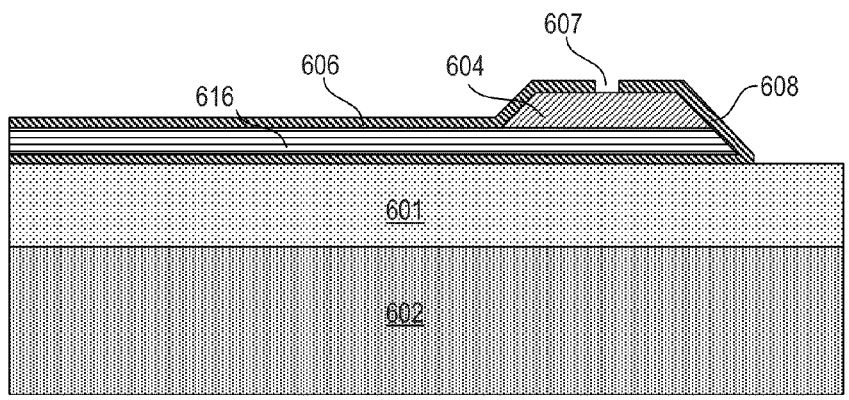

Next, in FIGS. 6E-6G, a negative patterning technique is used to form additional components of the electrodes. In FIG. 6E, second pattern 652A/652B is formed on mesa structure 604, according to an embodiment of the invention. In an embodiment, second pattern 652A defines the space separating the two electrodes to be formed on top of mesa structure 604. In an embodiment, second pattern 652B defines what will be the end of the spring arm portion of the transfer head.

Referring to FIG. 6F, second electrode layer 654 is blanket deposited over the top surfaces of the template comprising gap material 616, mesa structure 604, and second pattern 652A/652B, according to an embodiment of the invention. Similarly to first electrode layer 654, second electrode layer 654 may be formed using a non-conformal method, such as PVD. In an embodiment, second electrode layer 654 is formed from the same material as first electrode layer 650. Second electrode layer 654 may be from 0.1 to 1 μm thick. In an embodiment, second electrode layer 650 is a 500 Å thick layer of TiW.

Next, in FIG. 6G, second pattern 652A/652B is removed, along with the portions of second electrode layer 654 formed thereon, according to an embodiment of the invention. In an embodiment, removal of second pattern 652A/652B defines top electrode 606 from second electrode layer 654. A bottom electrode 608 is defined by the remaining portion of first electrode layer 650 and a portion of the second electrode layer, according to an embodiment. In an embodiment, bottom electrode 608 runs underneath mesa structure 604 and wraps around and over mesa structure 604. In an embodiment, the removal of second pattern 652A defines space 607 between top electrode 606 and bottom electrode 608. In a case where the template comprising gap material 616 and mesa structure 604 is formed from photoresist, the photoresist template may also be removed during the process used to remove second pattern 652A/652B.

Figure 6H:
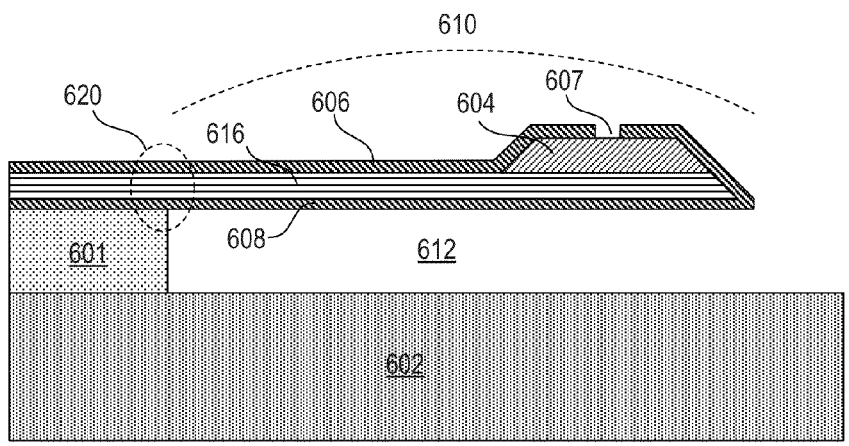

Referring to FIG. 6H, a portion of dielectric layer 601 is then etched to form space 612, according to an embodiment of the invention. In an embodiment, dielectric layer 601 material is laterally etched from underneath bottom electrode 608 to create spring arm 610 of a desired length. An amount of dielectric layer 601 material may remain on the surfaces of bottom electrode 608 and/or substrate 602 after the formation of space 612. Spring arm 610 is attached to dielectric layer 601 via spring anchor 620. Dielectric layer 601 material may be removed by any appropriate method, for example, a timed wet etch process. In an embodiment, space 612 is formed by using a wet etch process that is selective to dielectric layer 601 material over bottom electrode 608 material and substrate 602 material. In an embodiment, the process used to remove dielectric material 601 to create space 612 also removes the dielectric material forming the template comprising gap material 616 and mesa structure 604, so that gap material 616 and mesa structure 604 are air-filled. In an embodiment, the process used to remove dielectric material is precisely controlled to laterally etch underneath bottom electrode 608 to form spring arm 610 without etching portions of dielectric material that are critical to the transfer head structure. In another embodiment, the dielectric material forming the template comprising gap material 616 and mesa structure 604 has been selected so that it is not etched by the process used to remove a portion of dielectric layer 601.

Figure 6I:
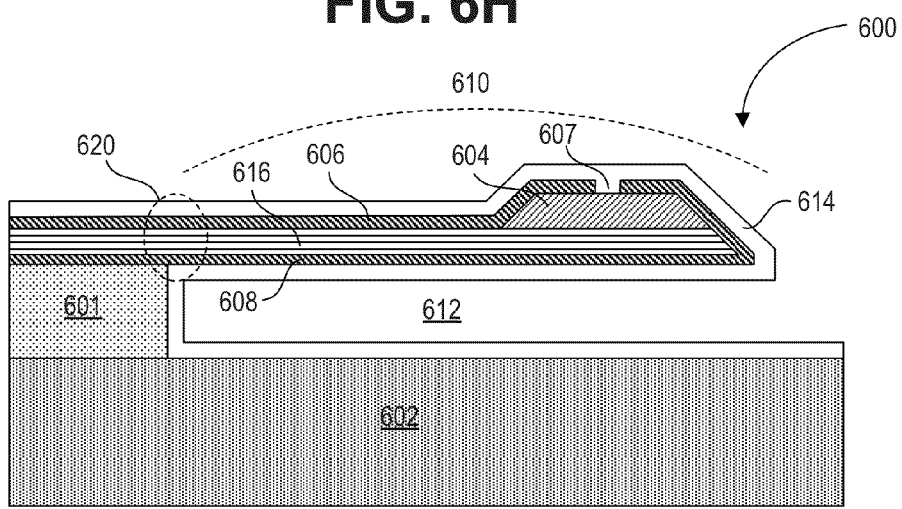

Dielectric layer 614 is then conformally deposited over the surfaces of spring arm 610 and underlying space 612, as shown in FIG. 6I, according to an embodiment of the invention. In an embodiment, dielectric layer 614 conforms to the surfaces of electrodes 606/608 and the surfaces of dielectric layer 601 and substrate 602 exposed within space 612. In an example embodiment where mesa structure 604 and gap material 616 are air-filled, dielectric layer 614 may also form on the surfaces of top electrode 606 and bottom electrode 608 that are internal to the spring arm 610. In an embodiment, dielectric layer 614 has a suitable thickness and dielectric constant for achieving the required grip pressure of the micro device transfer head, and sufficient dielectric strength to not break down at the operating voltage. Dielectric layer 614 may be a single layer or multiple layers. Suitable dielectric materials may include, but are not limited to, $Al_2O_3$, $Ta_2O_5$, $HfO_2$, and $SiO_2$ as described above with respect to dielectric layer 114. In an embodiment, dielectric layer 614 is from 0.5 to 1 μm thick. In an embodiment, dielectric layer 614 is a 0.5 μm thick layer of Al$_2$O$_3$. In an embodiment, dielectric layer 614 is deposited by atomic layer deposition (ALD).

Figure 7A:
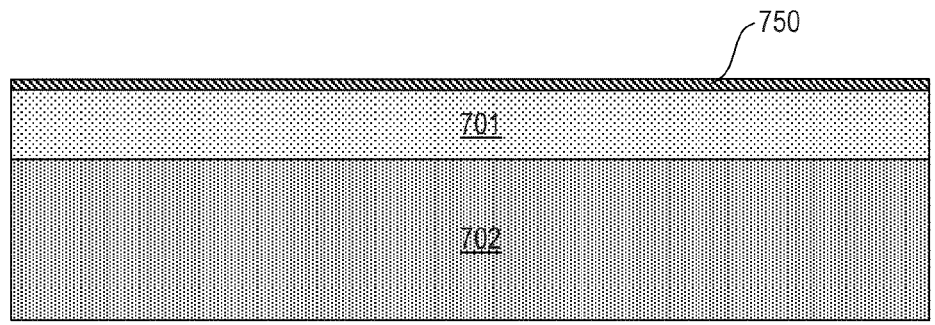
FIGS. 7A-7G are cross-sectional side view illustrations of sensor components of a cantilever micro device transfer head in accordance with an embodiment of the invention.

FIGS. 7A-7G illustrate a method for forming a micro device transfer head, according to an embodiment of the invention. In an embodiment, a substrate 702 is provided, having dielectric layer 701 and first electrode layer 750 formed thereon, as shown in FIG. 7A. In an embodiment, substrate 702, dielectric layer 701, and first electrode layer 750 may each have the characteristics discussed above with respect to substrate 602, dielectric layer 601, and first electrode layer 650, respectively. In an embodiment, base substrate 702 is silicon, dielectric layer 701 is silicon dioxide, and first electrode layer 750 is TiW. Dielectric layer 701 may be from 0.5-2 μm thick. First electrode layer 750 may be from 100 to 1000 nm thick.

Figure 7B:
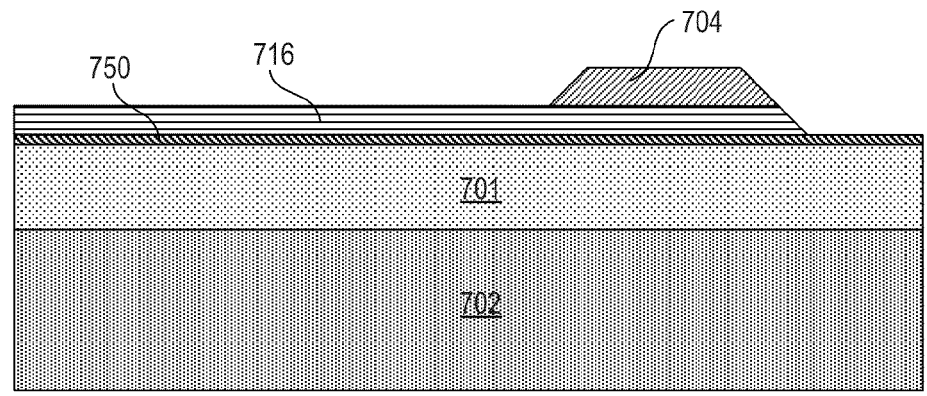

Referring to FIG. 7B, a template comprising gap material 716 and mesa structure 704 is formed over first electrode layer 750. The materials and dimensions of gap material 716 and mesa structure 704 may be as for gap material 116/616 and mesa structure 104/604, respectively, discussed above. The materials used to form gap material 716 and mesa structure 704 may be selected to either be resistant to subsequent fabrication processes or, alternatively, to be removed during subsequent processes. In an embodiment where gap material 716 and mesa structure 704 are formed from the same material as dielectric layer 701, first electrode layer 750 protects the surface of dielectric layer 701 during the etching processes that define gap material 716 and mesa structure 704.

Figure 7C:
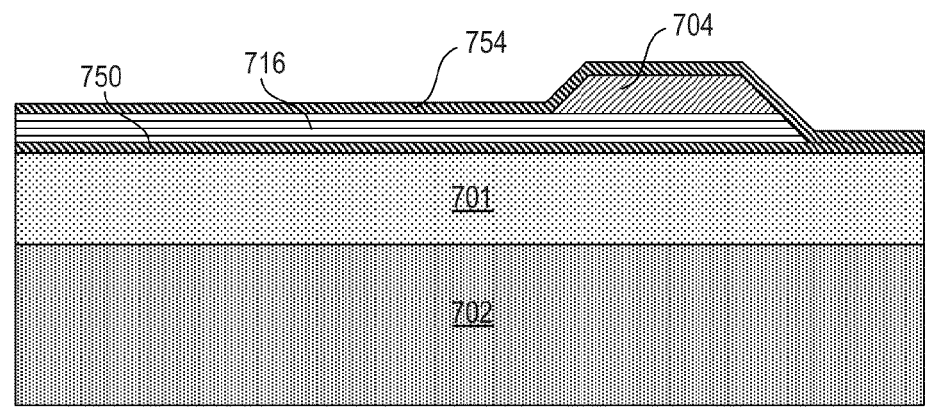

Next, in FIG. 7C, second electrode layer 754 is formed, according to an embodiment of the invention. In an embodiment, second electrode layer 754 is blanket deposited over the exposed top surfaces of gap material 716, mesa structure 704, and dielectric layer 701 according to an embodiment of the invention. Second electrode layer 754 may be formed by any appropriate method, such as CVD or PVD. Second electrode layer 754 is formed from any conductive material suitable for the formation of electrodes, as discussed above with respect to second electrode layer 654.

Figure 7D:
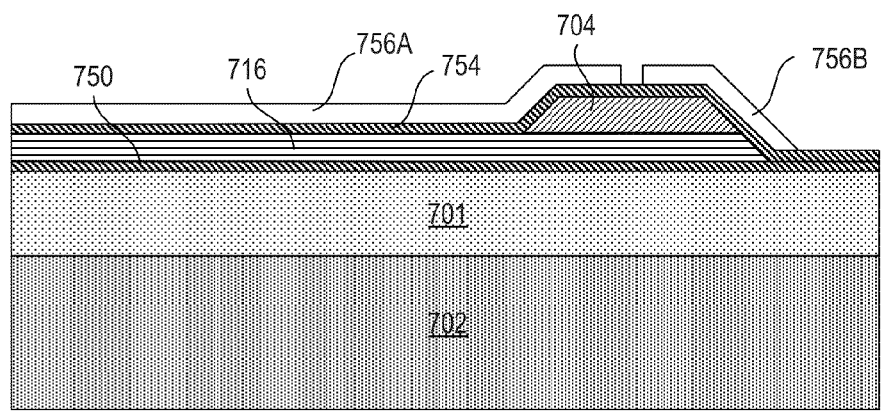

Next, first electrode layer 750 and second electrode layer 754 are patterned to form top and bottom electrodes, according to an embodiment of the invention. In FIG. 7D, pattern 756A/756B is formed over second electrode layer 754, according to an embodiment. In an embodiment, pattern 756A covers the portion of second electrode layer 754 that will form the top electrode. In an embodiment, pattern 756B covers the portion of second electrode layer 754 that will form a portion of the bottom electrode. Pattern 756A/756B may be formed from any suitable material, such as a photoresist or hardmask material.

The portions of second electrode layer 754 and first electrode layer 750 that are not protected by pattern 756A/756B are then etched to define top electrode 706 and bottom electrode 708, according to an embodiment. Second electrode layer 754 and first electrode layer 750 may be etched by any appropriate method. In an embodiment, a wet etch having a selectivity of at least 10:1 for the material forming electrode layers 750/754 over the material forming the mesa structure 704 is used. In an embodiment, the wet etch used to pattern electrode layers 750/754 has a selectivity of at least 10:1 for the material forming electrode layers 750/754 over the material forming dielectric layer 701.

Figure 7E:
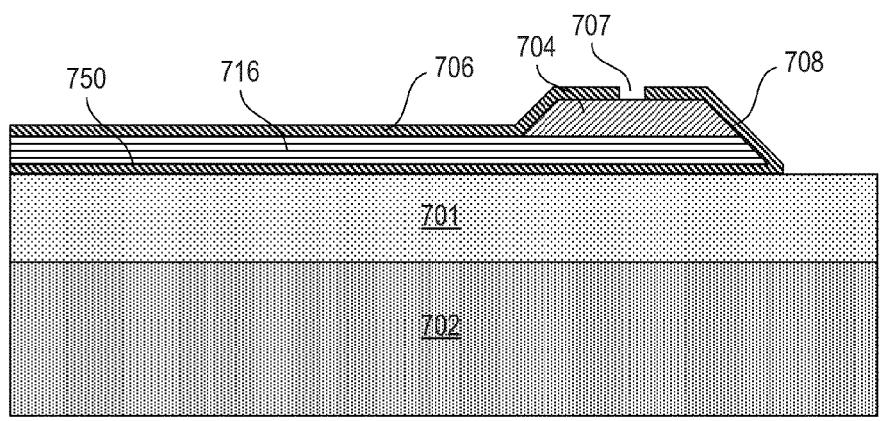

Pattern 756A/756B may then be removed by an appropriate method, as shown in FIG. 7E. In an embodiment, the process used to remove pattern 756A/756B also removes the material filling gap material 716 and mesa structure 704. For example, where the template including gap material 716 and mesa structure 704 is formed from photoresist, the process that removes pattern 756A/756B may also remove the photoresist filling gap material 716 and mesa structure 704. In another embodiment, the material filling gap material 716 and mesa structure 704 is not removed by the process used to remove pattern 756A/756B.

Figure 7F:
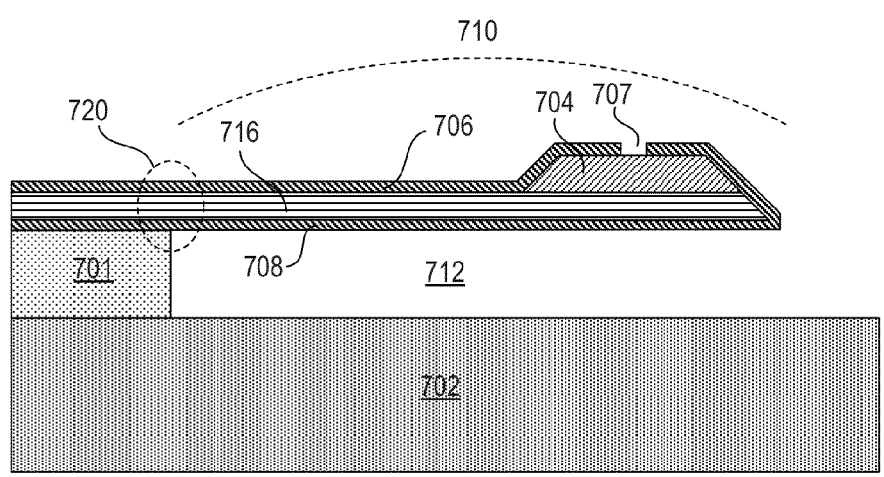

Next, as shown in FIG. 7F, a portion of dielectric layer 701 is removed from between bottom electrode 708 and substrate 702 to form space 712, according to an embodiment of the invention. In an embodiment, dielectric layer 701 is laterally etched underneath bottom electrode 708 to form space 712 and spring arm 710, which is suspended above space 712 and attached to dielectric layer 701 at spring anchor 720. Dielectric layer 701 may be removed by any appropriate process, such as a timed wet etch. As discussed above with respect to FIG. 6H, in an embodiment, where the material forming the template comprising gap material 716 and mesa structure 704 is a dielectric material, the process used to remove a portion of dielectric layer 701 may also remove all or a portion of the dielectric material filling the template, forming a hollow spring arm 710. In an embodiment, the process used to remove dielectric material is precisely controlled to laterally etch underneath bottom electrode 708 to form spring arm 710 without etching dielectric material that is critical to the transfer head structure.

Figure 7G:
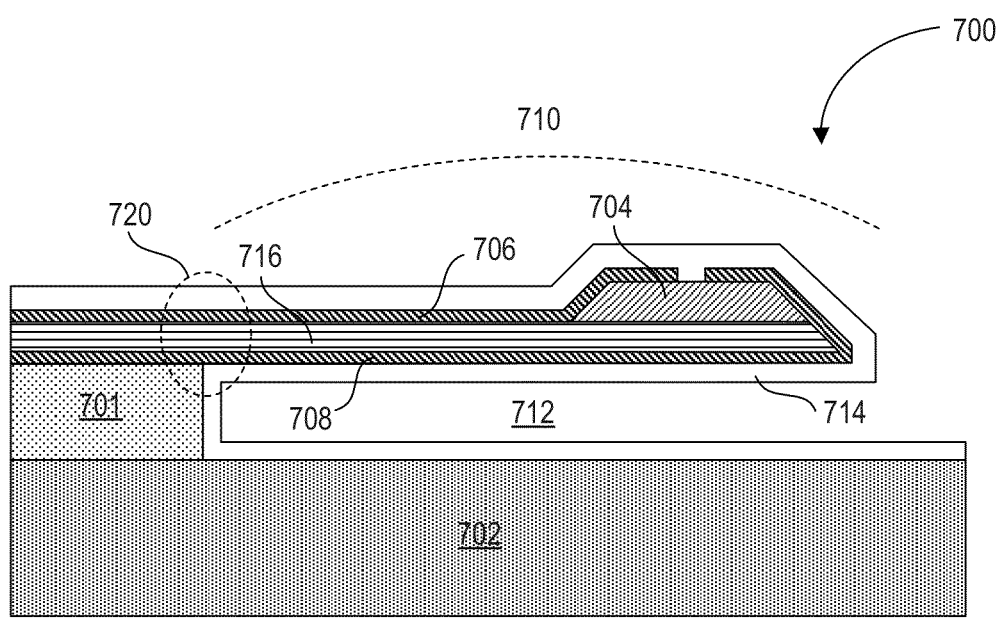

Referring to FIG. 7G, dielectric layer 714 is then conformally deposited over the surfaces of the spring arm 710 and underlying space 712. In an embodiment, dielectric layer 714 conforms to the surfaces of electrodes 706/708 and the surfaces of dielectric layer 701 and substrate 702 exposed within space 712. In an example embodiment where mesa structure 704 and gap material 716 are air-filled, dielectric layer 714 may also form on the surfaces of top electrode 706 and bottom electrode 708 that are internal to the spring arm 710. In an embodiment, the dielectric layer 714 has a suitable thickness and dielectric constant for achieving the required grip pressure of the micro device transfer head, and sufficient dielectric strength to not break down at the operating voltage. The dielectric layer 714 may be a single layer or multiple layers. Suitable dielectric materials may include, but are not limited to, Al$_2$O$_3$, Ta$_2$O$_5$, HfO$_2$, and SiO$_2$ as described above with respect to dielectric layer 114. In an embodiment, dielectric layer 714 is from 0.5 to 1 μm thick. In an embodiment, dielectric layer 714 is a 0.5 μm thick layer of Al$_2$O$_3$. In an embodiment, dielectric layer 714 is deposited by atomic layer deposition (ALD).

In utilizing the various aspects of this invention, it would become apparent to one skilled in the art that combinations or variations of the above embodiments are possible for forming a micro device transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method, comprising:
   forming a dielectric layer over a substrate;
   forming a first electrode layer over the dielectric layer;
   forming a template on the first electrode layer, wherein the template has a mesa structure;
   forming a second electrode layer over the template;
   patterning the second electrode layer and first electrode layer to form a bottom electrode and a top electrode; and removing a portion of the dielectric layer from underneath the bottom electrode to form a spring arm coupled to the substrate by a spring anchor, the spring arm including:

the mesa structure, wherein the mesa structure is suspended over the substrate;

the top electrode extending laterally from the spring anchor and over the mesa structure; and the bottom electrode extending laterally from the spring anchor underneath the mesa structure and wrapping around and over the mesa structure, wherein the top electrode and the bottom electrode are electrically isolated from each other.

2. The method of claim 1, wherein patterning the second electrode layer and first electrode layer includes:

forming a first negative pattern on the substrate defining a first portion of a bottom electrode;

sputtering the first electrode layer over the substrate and the first negative pattern; and removing the first negative pattern along with portions of the first electrode layer formed on the first negative pattern.

3. The method of claim 1, wherein patterning the second electrode layer and first electrode layer includes:

forming a second negative pattern on the template, wherein the second negative pattern defines the top electrode and a second portion of the bottom electrode;

forming the second electrode layer over the template and the second negative pattern; and removing the second negative pattern along with portions of the second electrode layer formed over the second negative pattern.

4. The method of claim 1, wherein patterning the second electrode layer and first electrode layer includes:

forming a pattern to define a first portion of the bottom electrode in the first electrode layer; and patterning to remove exposed portions of the first electrode layer to form the first portion of the bottom electrode.

5. The method of claim 1, wherein patterning the second electrode layer and first electrode layer includes:

forming a pattern to define the top electrode and a second portion of the bottom electrode in the second electrode layer; and patterning to remove exposed portions of the second electrode layer to form the second portion of the bottom electrode.

6. The method of claim 1, wherein removing a portion of the dielectric layer from underneath the bottom electrode comprises laterally etching a portion of the dielectric layer underneath the bottom electrode.

7. The method of claim 1, wherein the template is formed from an insulating material.

8. The method of claim 1, wherein the template is formed from photoresist.

9. The method of claim 1, further comprising removing the template.

10. The method of claim 1, further comprising forming a second dielectric layer covering the top electrode and the bottom electrode over the mesa structure.

* * * * *